United States Patent [19]

Richman

[11] Patent Number: 4,685,081

[45] Date of Patent: Aug. 4, 1987

[54] PELTIER JUNCTION USED FOR THERMAL CONTROL OF SOLID STATE DEVICES

[75] Inventor: Jay L. Richman, Montville, N.J.

[73] Assignee: Allied Corporation, Morris Township, Morris County, N.J.

[21] Appl. No.: 682,622

[22] Filed: Dec. 17, 1984

[51] Int. Cl.⁴ ............... G11C 19/08; H01L 35/30
[52] U.S. Cl. ............................ 365/1; 357/87
[58] Field of Search ............ 365/1, 27, 28, 2; 357/87

[56] References Cited

U.S. PATENT DOCUMENTS 4,238,759 12/1980 Hunsperger ................. 357/87
4,351,005 9/1982 Imai et al. .................. 357/87

OTHER PUBLICATIONS

IBM Technical Disclosure Bulletin-vol. 15, No. 6, Nov. 1972, pp. 2001-2002.
Intel Corp., Non-Volatile Memory Division Publication of "Bubble Memory In Military Applications" and How Bubble Memories Work, Motorola Bubble Memory Products ADI-773 (1983).
Mini-Micro World, Nov. 1983, pp. 41-44.
National Semiconductor "Application Note 132", p. 1 (Dec. 1974).

Primary Examiner—James W. Moffitt
Attorney, Agent, or Firm—Stanley N. Protigal; Howard G. Massung

[57] ABSTRACT

An electronic device, such as a bubble memory (21), which has a narrow temperature band of operation, is maintained within the narrow temperature band by a Peltier circuit (30). The Peltier circuit (30) includes a Peltier junction (31) which is placed in a heat conducting relationship with the bubble memory (21). The Peltier circuit (30) has the advantage of being able to alternately heat or chill the bubble memory device (21) in order to maintain the bubble memory device (21) within its recommended temperature range.

21 Claims, 5 Drawing Figures

PELTIER JUNCTION USED FOR THERMAL CONTROL OF SOLID STATE DEVICES

BACKGROUND OF THE INVENTION

This invention relates to thermal control of solid state electronic devices, and more specifically to the control of temperature of such devices by use of external heat and external chilling.

Solid state electronic components are frequently susceptible to temperature-induced changes in their response. In addition to ambient temperature effects, many solid state devices generate significant amounts of heat during their operation, further complicating such temperature-related problems.

In order to overcome these problems, circuit designers will often specify solid state devices with increased temperature ranges of operation, at considerably higher costs. Other attempts to extend operating temperature range have employed multi-slope biasing and adjustments of sensing threshold levels.

Bubble memories have received attention as a result of the ability of the bubble memory to provide non-volatile memory capacity and because of the rugged nature of bubble memories over other non-volatile memory systems. Bubble memories, however, have been limited in their application as a result of temperature sensitivity.

Referring to FIG. 1, a typical bubble memory has upper and lower limits of operation which change significantly as a result of changes in temperature. In the example given, the upper limit of operation is indicated by the curve U and the lower limit of operation is indicated by the curve L. As can be seen, a safe field bias at one temperature may be out of range at another temperature. Referring to FIG. 2, since threshold levels for a typical bubble memory tend to vary, particularly at the "1" logic level. The "one" level decreases to approach the "0" logic level at higher temperatures within the rang of operation of the bubble memory. A sense threshold, at which circuitry distinguishes between the "0" and "1" logic levels is therefore established at a level which is slightly greater than the "0" logic level in order to obtain a maximum range for the bubble memory.

Referring again to FIG. 1, the establishment of a bias level for extended temperature ranges is more difficult. A conventional bias level would exceed the upper limit of operation at very low and very high temperatures. Therefore, a multi slope bias is chosen, in which the bias is adjusted for temperature in order to follow, to the extent practical, the multi slope bias curve shown in FIG. 1.

In order to reduce temperature effects, heat sinking and thermally controlled environments are used in order to attempt to maintain the solid state device at an appropriate temperature. The provision of such environmental temperature controls imposes some restriction on the use of a circuit which includes the bubble memory, thereby reducing its convenience.

Accordingly, it is an object of a present invention to provide a method of controlling temperature of a solid state device in order to efficiently bring the temperature of the solid state device within an acceptable range. It is a further object to provide a temperature control system for a solid state device which is convenient to operate and is adaptable to a wide variety of environmental conditions. It is a further object of the present invention to provide a system using a bubble memory which is suitable for use in a wide variety of ambient conditions. It is a further object of the present invention to provide a system having a non-volatile memory which is light in weight and which is durable. It is a further object of the present invention to provide a system having a compact readily accessible randon access memory. It is further object of the present invention to provide a bubble memor in which costs are reduced by readily maintaining the bubble memory within a desired temperature range.

SUMMARY OF THE INVENTION

In accordance with the present invention, a Peltier junction module is juxtaposed with an electronic component in order to maintain the electronic component at a desired temperature. In one embodiment, the component is a bubble memory and the Peltier junction is mounted between a printed circuit board or other seating plane.

In an alternate embodiment, the Peltier junction is mounted adjacent to the circuit component and on a side of the component opposite that of the seating plane. In this manner, the circuit component is sandwiched between the Peltier junction and the seating plane. A heat sink may be used in order to further stabilize the temperature of the circuit component. The heat sink may be mounted between the Peltier junction or the circuit component. Alternatively, the heat sink may be mounted so that the Peltier junction is sandwiched between the heat sink and the circuit component. It is further possible to encapsulate the circuit component within a heat sink, with the Peltier junction located within the capsule. In yet a further embodiment, the circuit component may be encapsulated by the heat sink and the Peltier junction may be mounted exteriorly of the heat sink.

In order to maintain temperature of the circuit device within a preferred temperature of operation, the Peltier junction is connected to an appropriate controller circuit which reacts to sense temperature in order to control current flow to the Peltier junction. The temperature controller may be used to provide heat as well as chilling through the Peltier junction. Temperature sensing may be accomplished by any convenient means, including by sensing an electrical parameter of the circuit element.

DETAILED DESCRIPTION OF THE PREFERRED EMBODIMENTS

Figure 1:
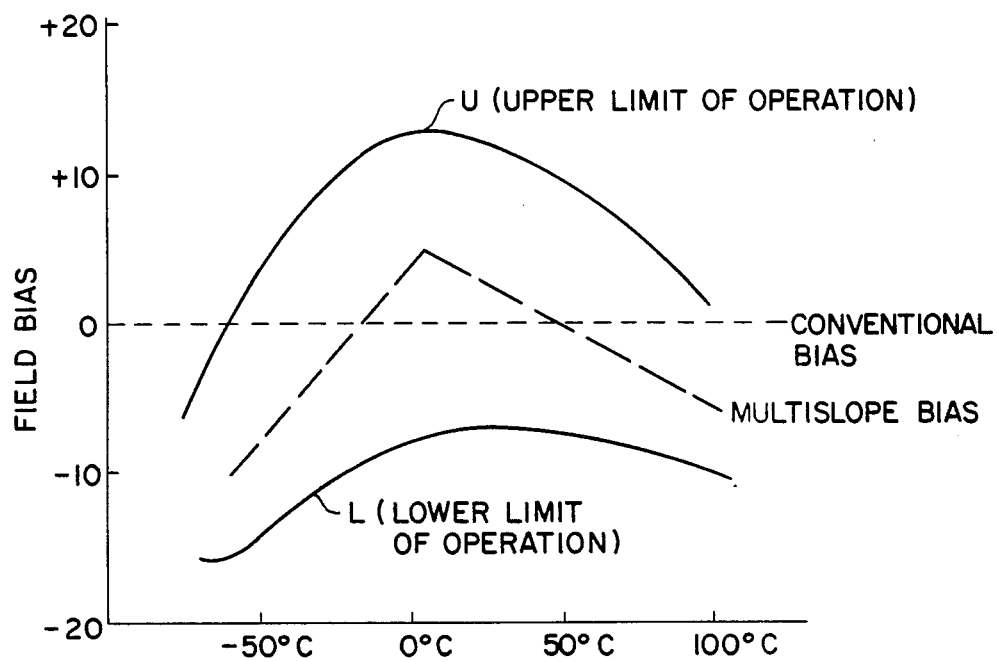
FIG. 1 graphically shows upper and lower limits of field bias versus temperature for a typical bubble memory device.

By way of example, the present invention will be described in association with a bubble memory device. A bubble memory device has operational parameters which vary significantly with temperature. Referring to FIG. 1, field bias which is set at a optimum level can readily exceed the upper limit of operation, represented by curve U. If, for example, field bias is chosen at the level of the dashed line, representing conventional bias, reliable operation can only be achieved within a limited temperature range, where the bias level maintains a safe margin from the upper limit of operation. If this bias were to be lowered, then the bias could be reduced below the lower limit of operation at the median anticipated temperature. In order to extend the temperature range of operation for the device, a multislope bias is supplied, in which bias levels are varied in order to approximate the parameters shown for the multislope bias in FIG. 1.

Figure 2:
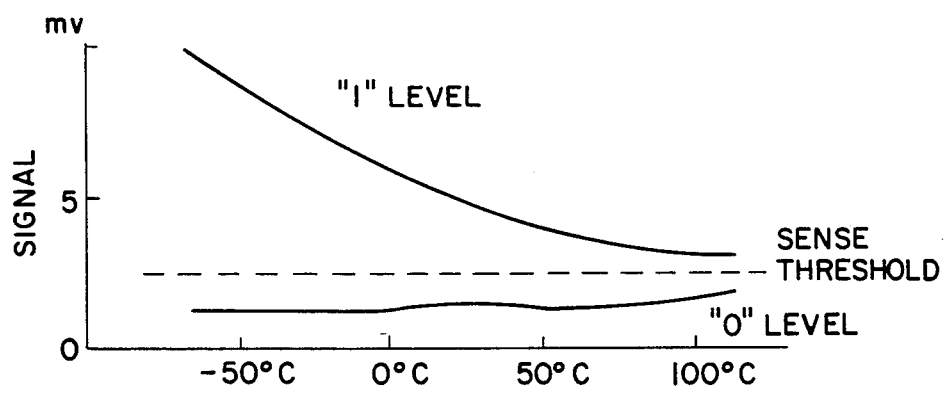
FIG. 2 graphically shows detector output versus temperature for the bubble memory device.

Referring to FIG. 2 threshold levels for signal output also vary with temperature, with the "1" logic level approaching the "0" logic level at higher temperatures of operation. In order to obtain the maximum temperature range from the device, it is necessary to take into account a "worst case" condition, in which the device is operating at higher temperatures. This makes the device more susceptible to noise, because the sense threshold level must be set fairly close to the "0" logic level.

Figure 3:
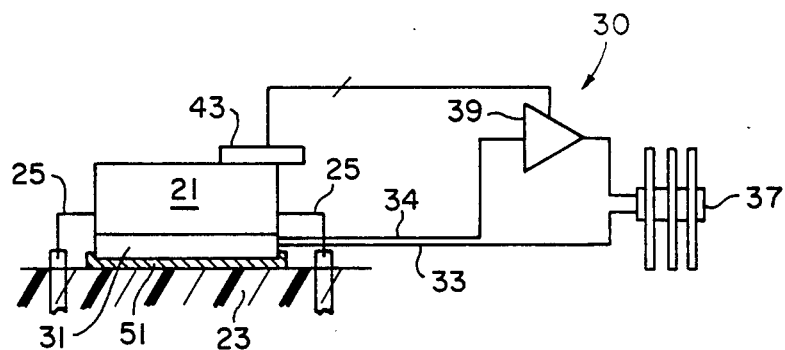
FIG. 3 shows an embodiment of the invention.

With reference to FIG. 3, a bubble memory device 21 is mounted to a printed circuit board 23, with leads 25 attached to appropriate circuit connections. In order to maintain the bubble memory device 21 and an appropriate operating temperature, a Peltier circuit 30 is provided, in which an active Peltier circuit junction 31 is juxtaposed to the bubble memory device 21.

Peltier circuits are well known and consist of two Peltier circuit junctions, such as Peltier circuit junction 31, connected by conductors and a current controlling device. Peltier junction 31 is a bimetalic junction, in which current is passed through a pair of conductors 33, 34 to a second Peltier circuit junction 37. The conductors 33, 34 and the Peltier circuit junctions 31, 37 formed a complete Peltier circuit 30 although a current source or load, such as amplifier 39 is usually included in the Peltier circuit 30. If one of the Peltier circuit junctions 31 or 37 is heated, then an electromotive force (EMF or voltage) is established across the junctions 31, 37, thus urging current to flow through the circuit 30. If current is induced to flow through the circuit 30, then one of the junctions 31, 37 will absorb heat, while the other junction produces heat. The purpose of amplifier 39 is to induce such current or, where circumstances permit, to allow current to flow through the conductors 33, 34.

A temperature sensor 43 is used to sense the temperature of the bubble memory device 21 and to provide an indication of that sensed temperature to amplifier 39. The temperature sensor 43 can be any of a variety of temperature sensing devices which vary electrical output in response to different sensed temperatures levels. Such devices include sensing thermistors and may even include a part of the bubble memory device 21, provided that an approximate indication of the temperature of the bubble memory device 21 can be obtained. The amplifier 39 responds to the sensed temperature in order to cause current to flow through the Peltier circuit 30 in a direction which will either increase or decrease the temperature of the active Peltier circuit junction 31 in order to bring the bubble memory device 21 within an optimum temperature range.

The temperature of the bubble memory device 21 tends to increase in response to active use of the bubble memory device 21. Therefore, the temperature of the bubble memory device 21 is dependent on use as well as ambient conditions. In order to better control the temperature of the bubble memory device 21, the amplifier 39 will establish a target temperature and depress that target temperature in response to a sensed use of the bubble memory device 21.

The Peltier circuit 30 has the advantage that, by reversing the direction of current flowing through the Peltier circuit 30, the active Peltier circuit junction 31 can be alternately used to heat or chill the bubble memory device 21. Thus, it is possible to narrow the temperature range of operation of a bubble memory device 21 in order to allow bubble memory device 21 to be of a type with a limited permissible temperature range.

The operation of amplifier 39 in response to temperature sensed by the temperature sensor 43 will be understood by those skilled in the art. As an example, amplifier 39 may include a circuit such as is described in National Semiconductor Application Note 132, by Peter Lefferts (December, 1974), at pp 6–7, describing "The Anticipating Controller." The anticipating controller must then provide an output to a current controller which anticipates current passing through conductor 34. Of course, the function of amplifier 39 can be performed by one of many circuits which senses temperature and controls current flowing through a conductor in response to the sensed temperature.

In order to further stabilize temperature at the bubble memory 21, a heat sink 51 is placed in a heat conducting relationship with the bubble memory device 21. In the example of FIG. 3, the heat sink 51 is placed between the printed circuit board 23 and the active Peltier circuit junction 31. This allows the active Peltier circuit junction 31 to use the heat sink 51 to stabilize its temperature, with direct thermal contact with the bubble memory device 21 being effected through the active Peltier circuit junction 31. The temperature sensor 43 will be responsive to heat sink temperature as well as the temperature of the bubble memory device 21, thereby anticipating environmental influences on the temperature of the bubble memory device 21.

Figure 4:
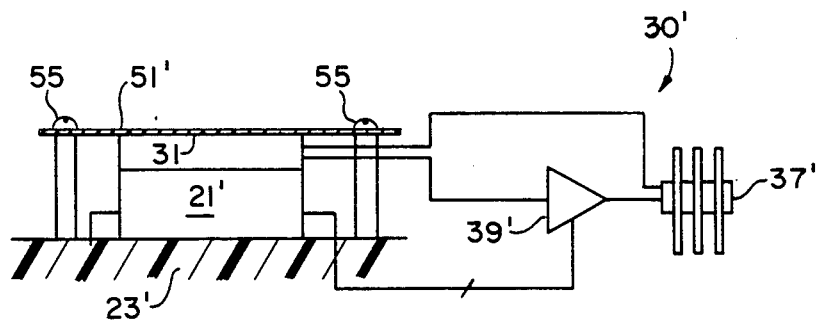
FIG. 4 shows one alternate embodiment of the invention.

In FIG. 4, a bubble memory device 21' is sandwiched between a printed circuit board 23' and an active Peltier circuit junction 31'. A heat sink 51' is placed on an opposite side of the active Peltier circuit junction 31'. Pressure is applied to the heat sink 51' by fasteners 55 in order to secure the active Peltier circuit junction 31' and the bubble memory device 21' to the printed circuit board 23'. The force applied by the fasteners 55 also increases the pressure between these components and thereby increases thermal conductivity. Peltier circuit 30' uses a second Peltier circuit junction 37' in a manner similar to Peltier circuit 30.

In FIG. 4, a separate temperature probe (sensor 43 in FIG. 3) is avoided by using the bubble memory 21' as a temperature sensor for controlling the Peltier circuit 30'. This sensing of temperature can be through a dedicated portion of the bubble memory 21' or can be accomplished by measuring an electrical property in a circuit incorporating the bubble memory 21'.

Figure 5:
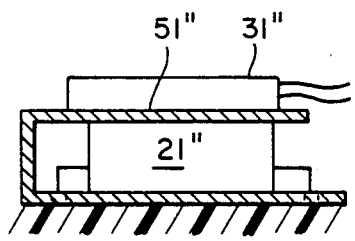
FIG. 5 shows another alternate embodiment of the invention.

In FIG. 5, a bubble memory device 21" is partially encapsulated by a heat sink 51", and an active Peltier circuit junction 31" is mounted exteriorly of heat sink 51" so that heat is transferred through the heat sink 51" when being exchanged between the bubble memory device 21" and the active Peltier junction 31".

It is possible to eliminate the heat sink component from the assembly and to control the temperature of the bubble memory device by using only the Peltier circuit.

As can be seen in FIGS. 3 and 4, the Peltier circuit can be mounted either between the bubble memory device 21 and the printed circuit board 23 (FIG. 3) or with the bubble memory device 21' between the active Peltier circuit junction 31' and the printed circuit board 23' (FIG. 4). For this reason, variations on the specific construction of the apparatus can be made within the scope of the invention as defined by the claims.

I claim:

1. Temperature control system for a solid state device having threshold levels of logic in which heating and chilling is controlled locally at the device, characterized by:
    (a) a pair of Peltier junctions in a Peltier circuit, one of which Peltier junctions is placed in thermal communication with the solid state device;
    (b) temperature sensing means, responsive to temperature of the solid state device;
    (c) a current control circuit which is responsive to the temperature sensing means and which controls current flow in the Peltier junction circuit in response to a difference in temperature between a predetermined target temperature and temperature sensed by the temperature sensing means; and
    (d) the temperature sensing means being thermally connected to said solid state device.

2. Apparatus as described in claim 1 further characterized by:
    the current control circuit changing the target temperature by depressing the target temperature in response to active usage of the solid state device.

3. Apparatus as described in claim 1, further characterized by:
    the temperature sensing means being a separate temperature sensing element in thermal communication with the solid state device.

4. Apparatus as described in claim 3, further characterized by:
    said temperature sensor being a thermister.

5. Apparatus as described in claim 1, further characterized by:
    said means for controlling current flow being further responsive to means detecting a difference in temperature between ambient temperature and target temperature.

6. Apparatus as described in claim 5, further characterized by:
    the temperature difference sensing means sensing an electrical potential across the Peltier circuit.

7. Apparatus as described in claim 5 further characterized by:
    the temperature difference sensing means including an ambient temperature sensor.

8. Apparatus as described in claim 6 further characterized by:
    the temperature difference sensing means including an ambient temperature sensor.

9. Apparatus as described in claim 1, further characterized by:
    a heat sink in thermal communication with the active Peltier junction and said solid state device.

10. Apparatus as described in claim 9, further characterized by:
    the active Peltier junction being sandwiched between the heat sink and said solid state device.

11. Apparatus as described in claim 9, further characterized by:
    the heat sink being fastened by fastening means to a circuit board, with the active Peltier junction and said solid state device being sandwiched between the heat sink and the circuit board; and
    the fastening means providing a clamping force, through the heat sink, between the solid state device and the active Peltier junction.

12. Bubble memory device which is maintained at a desired temperature range during operation and which includes a bubble memory module, characterized by:
    a Peltier junction in thermal communication with the bubble memory module;
    a Peltier circuit incorporates said Peltier junction;
    temperature sensing means responsive to temperature of the bubble memory module;
    a current control circuit responsive to the temperature sensing means, the temperature control circuit maintaining current flow in the Peltier circuit in response to a difference in temperature between a predetermined target temperature and temperature sensed by the temperature sensing means.

13. Apparatus as described in claim 12, characterized by:
    the temperature sensing means being a separate temperature sensing element in thermal communication with the bubble memory device.

14. Apparatus as described in claim 12, further characterized by:
    the temperature sensing means being a circuit which includes the bubble memory device.

15. Apparatus as described in claim 12 further characterized by:
    the current control circuit changing the target temperature by depressing the target temperature in response to active usage of the bubble memory device.

16. Apparatus as described in claim 12, further characterized by:
    means to sense a difference in temperature between the bubble memory device and an ambient temperature.

17. Apparatus as described in claim 16, further characterized by:
    the temperature difference sensing means sensing an electrical potential across the Peltier circuit.

18. Apparatus as described in claim 16 further characterized by:
    the temperature difference sensing means including an ambient temperature sensor.

19. Temperature control system for a solid state device in which heating and chilling is controlled locally at the device, characterized by:
    (a) a pair of Peltier junctions in a Peltier circuit, one of which Peltier junctions is placed in thermal communication with the solid state device;
    (b) temperature sensing means, responsive to temperature of the solid state device;
    (c) a current control circuit which is responsive to the temperature sensing means and which controls current flow in the Peltier junction circuit in response to a difference in temperature between a predetermined target temperature and temperature sensed by the temperature sensing means;
    (d) a heat sink in thermal communication with the active Peltier junction and said solid state device;
    (e) the heat sink being fastened by fastening means to a circuit board, with the active Peltier junction and said solid state device being sandwiched between the heat sink and the circuit board; and (f) the fastening means providing a clamping force, through the heat sink, between the solid state device and the active Peltier junction.

20. Apparatus as described in claim 19 further characterized by:
the temperature difference sensing means including an ambient temperature sensor.

21. Apparatus as described in claim 19 further characterized by:
the current control circuit changing the target temperature by depressing the target temperature in response to active usage of the solid state device.

* * * * *